United States Patent [19]

Simic-Glavaski

[11] Patent Number: 4,804,930
[45] Date of Patent: Feb. 14, 1989

[54] MOLECULAR ELECTRO-OPTICAL TRANSISTOR AND SWITCH

[75] Inventor: Branimir Simic-Glavaski, Cleveland Hts., Ohio

[73] Assignee: H.S.G. Venture, Cleveland, Ohio

[21] Appl. No.: 914,121

[22] Filed: Oct. 1, 1986

Related U.S. Application Data

[63] Continuation of Ser. No. 535,672, Sep. 26, 1983, abandoned.

[51] Int. Cl.$^4$ .................... H03K 19/14; G11C 13/00; H01S 3/00
[52] U.S. Cl. ................................. 332/751; 356/301; 365/153; 455/611; 350/355
[58] Field of Search ............... 332/7.51; 365/151, 153, 365/107; 356/301; 350/DIG. 1, 355, 356; 455/608, 611

[56] References Cited

U.S. PATENT DOCUMENTS

| | | | |
|---|---|---|---|
| 3,119,099 | 1/1964 | Biernat | 365/151 |
| 3,833,894 | 9/1974 | Aviram et al. | 365/151 |
| 4,032,901 | 6/1977 | Levinthal | 365/153 |
| 4,131,517 | 12/1978 | Mitsuo et al. | |
| 4,574,366 | 3/1986 | Potember et al. | 365/127 |

FOREIGN PATENT DOCUMENTS 1412230 10/1975 United Kingdom .
1543097 3/1979 United Kingdom .

OTHER PUBLICATIONS

Eesly et al., "Enhanced Raman Scattering", 9/79, pp. 815-819, Solid State . . . , vol. 150 (1-2).
Potember et al., "Optical Switching . . . Films", '82, pp. 548-550, Appl. Phys. Lett., vol. 41.
Liao, "Enhanced Raman Scattering . . . ," 12/81, p. 105, IEEE Journal of Quantum Elec., vol. QE-17.
Kotz et al., "Raman Spectroscopy . . . Electrode," 1980, pp. 113-125, J. Electroanal. Chem., vol. 113.
Simic-Glavaski et al., "Study of Surfaces," 1983, J. Electroanal. Chem., vol. 150, pp. 469-479.
Simic-Glavaski et al., "Study of . . . Electrode Surfaces," 1983, J. Electroanal. Chem., vol. 150 (1-2) pp. 469-479.
Electronics, "Light Electric Pulses Switch Organic Films", Jul. 28, 1982.

Primary Examiner—Nelson Moskowitz
Attorney, Agent, or Firm—Renner, Otto, Boiselle & Sklar

[57] ABSTRACT

Observable changes in the electrical and optical characteristics of individual molecules adsorbed on a conductor or semi-conductor caused by the electrical and/or optical excitation or de-excitation of electrons within such molecules can be used as signals which in turn can be used to carry information and such observable information carrying changes or signals can be switched, amplified, and modulated by varying the optical as well as the electrical inputs to such molecules. In the invention electro-optical molecules are adsorbed on a substrate. The natural characteristic of such a molecule is altered by ionization or electron transfer; more specifically an electron is excited to an excited state. Electron transfer, trapping, or excitation/state change, or molecule ionization is effected and controlled as a function of (1) electric potential across an adsorbed molecule or a layer or layers of such molecules and/or (2) wavelength(s)/frequency(ies) and intensity(ies) of the incident illumination thereof. Such electron transfer, trapping, or state change causes a change in the natural or non-perturbed optical response of the adsorbed molecule. The optical response can be detected using Raman spectroscopy, preferably surface enhanced Raman spectroscopy. Such detection or analysis provides a spatial distribution of the Raman lines, each having a particular intensity or magnitude level, thus providing multioutput and multilevel operation of the device. Analysis of the frequency or spatial distribution as well as the intensity of such output signal(s) or information identifies where such electron is trapped or transferred in the adsorbed molecule. Operation is at high speed, e.g. on the order of $10^{-13}$ to $10^{-15}$ second, and is functional at conventional room ambient temperatures.

87 Claims, 6 Drawing Sheets

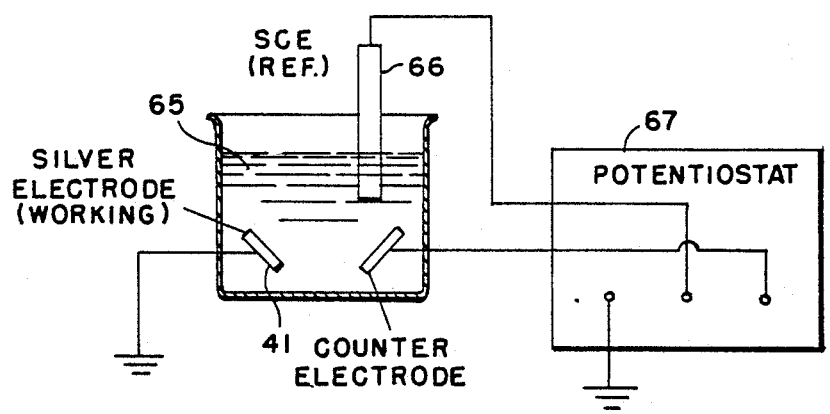
_Fig. 8_
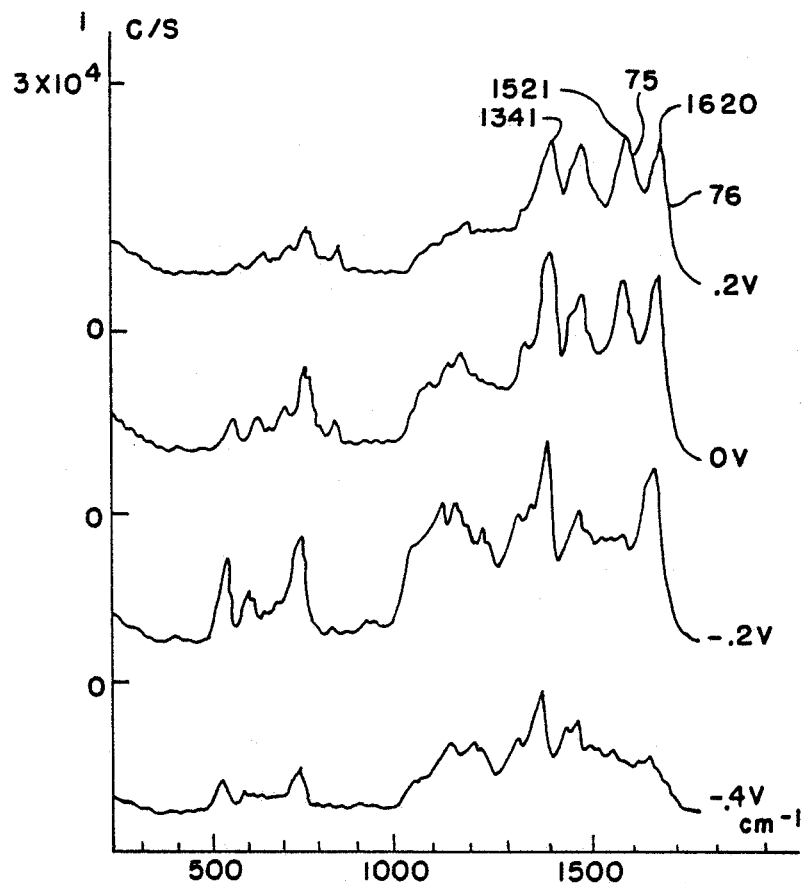
_Fig. 9_

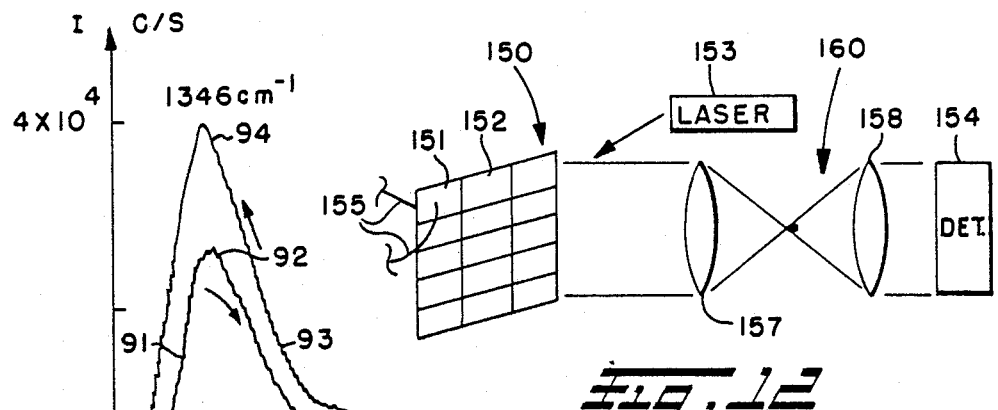
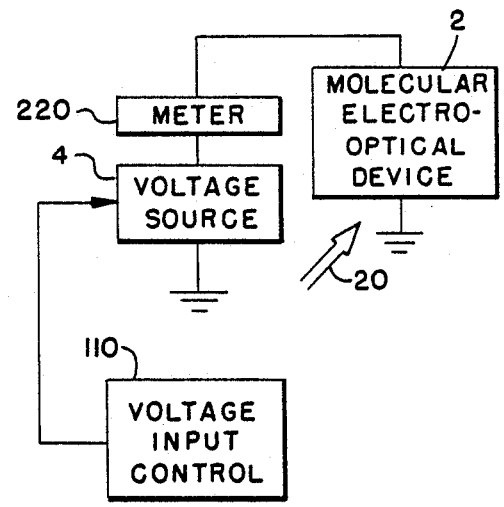
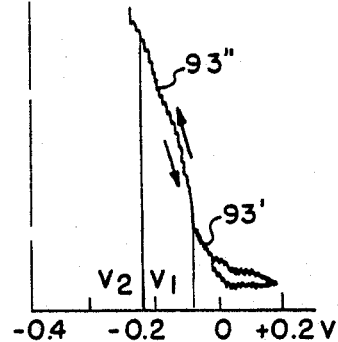
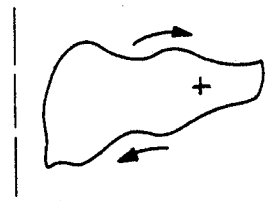
Fig. 10a
Fig. 10b
Fig. 10c
Fig. 12
Fig. 13

MOLECULAR ELECTRO-OPTICAL TRANSISTOR AND SWITCH

This is a continuation of co-pending application Ser. No. 535,672 filed on Sept. 26, 1983, now abandoned.

This invention relates generally, as indicated, to molecular electronic and optical devices, and, more particularly, to electro-optical transistors and switches of the molecular type.

An objective of the present invention is to improve speed of cycling response of a computer element and to increase the density of memory. Another objective is to improve speed of communicating information. An additional objective is to facilitate using light for information communication and signal processing. A further objective is to facilitate interfacing electrical and optical information, signals, etc.

In the past signals were derived from a large number of molecules making up a material on a so-called macro level, an example being the transistor. Now, according to the present invention, signals are derived from changes in state in a single molecule. These individual states can be read out or analyzed by Raman spectroscopy techniques or perhaps by other optical analysis techniques. In order to resolve the signal spatially and in intensity Raman spectroscopy is preferred.

Typical response times for conventional electrical devices, e.g. to accomplish a switching function, have been on the order of $10^{-9}$ or $10^{-10}$ second. Various techniques for still more quickly switching signals and information have been developed, such as the Josephson junction. A disadvantage to such fast-acting electrical switches or switch junctions has been the extreme temperature requirements. For example, a Josephson junction type of fast-acting electrical switch must be very cold, e.g. super cooled. Typically liquid helium is used to maintain the switching junction at the desired cold temperature for proper operation. The cost and space requirements to maintain such temperature conditions are counter-productive to the goals of cost reduction and miniaturization, which are highly sought in the computer field, for example.

One aspect of the present invention relates to electrical modulation of an optical output signal or information. Another aspect relates to optically modulating an optical output signal or information. Yet another aspect is to achieve a signal amplification effect. An additional aspect relates to the optical modulation of an electrical signal or information. A further aspect relates to switching signals or information at high speed, and still another aspect is the miniaturization of such switching apparatus. Yet a further aspect is to combine two or more of such aspects or features in a single device. Such features of the invention may be utilized, for example, in computers for switching, memory, input, output and/or other functions; and such features also may be otherwise used, for example, in electrical, optical and/or other systems and devices.

The inventor has discovered that the observable changes in the electrical and optical characteristics of individual molecules caused by the electrical and/or optical excitation or de-excitation of electrons within such molecules can be used as signals which in turn can be used to carry information and that such observable information carrying changes or signals can be switched, amplified, and modulated by varying the optical as well as the electrical inputs to such molecules.

In the invention electro-optical molecules are adsorbed on a substrate. The natural characteristic of such a molecule is altered by ionization or electron transfer; more specifically an electron is excited to an excited state. Electron transfer, trapping, or excitation/state change, or molecule ionization is effected and controlled as a function of (1) electric potential across an adsorbed molecule or a layer or layers of such molecules and/or (2) wavelength(s)/frequency(ies) and intensity(ies) of the incident illumination thereof. Such electron transfer, trapping, or state change causes a change in the natural or non-perturbed optical response of the adsorbed molecule. Thus, state and state change as they are used herein refer to electron location within a molecule, energy level of such electron, and/or spin state of such electron. The optical response can be detected using Raman spectroscopy, preferably surface enhanced Raman spectroscopy. Such detection or analysis provides a spatial distribution of the Raman lines, each having a particular intensity or magnitude level. Analysis of the frequency or spatial distribution as well as the intensity of such output signal(s) or information identifies where such electron is trapped or transferred in the adsorbed molecule.

The frequency or spatial distribution of such output signal, therefore, is a function of the location in the molecule at which the electron is trapped or transferred; i.e. which electron has had a state change. Such state change or trapping may be referred to equivalently herein. Such trapping or electron excitation affects the natural vibrational characteristics of molecular bonds of the adsorbed molecule. Indeed, for example, in response to a particular electrical potential applied to adsorbed molecules and a particular optical input to such molecules, the natural vibrational state of one of the molecular bonds of such molecule may be altered to emit an optical or light output having a characteristic frequency or Raman spatial distribution that can be detected and analyzed and used for signalling or informational purposes. Using Raman spectroscopy input laser light of a given frequency will beat with the frequency of vibration of a particular band to cause re-emission of light from the molecule, and such re-emitted light or scattered light then has a spectral component that is related to such vibrational characteristic of the bond. Thus, excitation of an electron in a molecule to distort and, therefore, to change the vibrational character of a bond therein will affect the optical output from the molecule.

Since the invention takes advantage of light that is emitted in response to intramolecular electron excitation mechanisms, the response of the optical output signals is limited by the lifetimes of the vibrational excited states, for example on the order of about $2 \times 10^{-13}$ second. Response times on the order of $10^{-15}$ second are expected to be observed for molecules that exhibit tunnelling. Moreover, it has been discovered that such extremely fast response is achievable at typical room ambient temperatures without requiring super cooling, such as that needed for Josephson junction technology. Such response may be detected, e.g. by a light sensor, thereby to provide fast switching, read-out, etc. functions.

The invention may be used to obtain from the output light emitted by the molecule(s) one or more distinct output signals, each of which may be at different intensity levels. Such signals are distinguished from each other in the frequency domain. Single or multiple signal outputs from the overall system is possible. The Raman spectrum line from a distinct frequency then would represent a specific output signal or information which could be used in multilevel fashion, such as multilevel logic, etc. The existence of such a line and the intensity thereof can be used as or can be used to derive output information. Thus, for example, for such multisignal output use, while maintaining a constant incident illumination of the adsorbed molecules, changing the applied potential may cause various ones of the Raman spectrum output lines to vary respectively in intensity; such variations need not necessarily be the same for each line. For single output, while maintaining a constant incident illumination of the adsorbed molecules, as will be described in greater detail below, variation of the potential across the adsorbed molecules can effect a modulation of the Raman signal. Conversely, a similar effect on the output may be achieved by changing the intensity and/or wavelength(s)/frequency(ies) of the incident illumination while maintaining constant the applied electric potential and incident illumination.

The invention envisions the realization that a molecular size device can be used to derive an output that can be treated as a signal for carrying information and such signals can be modulated at very high speeds. To accomplish that purpose the invention achieves an operative system by selecting a molecular species and means for applying thereto the electrical and optical inputs to obtain detectable outputs.

Preferred molecules would be macrocyclics, such as phthalocyanines, porphyrines, chlorophyls, hemes, or cytochromes. However, other molecules may be used according to the invention if they respond to the desired input to achieve an excited state that can produce a useful detectable output. For some applications of the invention the molecules, and preferably macrocyclics, should exhibit semiconductor properties.

To apply electric potential to or to obtain electric polarization of the molecules, the molecules should be adsorbed on a conducting or semiconducting substrate. Preferable conducting substrates would be, for example, silver, gold, copper, and aluminium, and halides of these metals; the most preferred would be silver and silver halides. Preferred doped or non-doped semiconductor substrates would be, for example, galium arsenide, tin oxide, zinc oxide, silver oxide, cadmium sulfate, germanium. Organic material exhibiting similar characteristics also may be used as the substrate. It is possible that metallic substrates are more effective when they are covered by semiconductor films interfaced between the metallic substrate and the specific molecules.

Optical input may be provided by a monochromatic light source, such as one or more lasers. However, a non-monochromatic light source may be used if a light sensitive molecular species, such as rhodopsin, is attached as a polar group to or will otherwise form a chemical bond with the subject molecule to function as an input molecule therefore. In such case the electrons in the light sensitive input molecular species are excited by the light input, and this excitation is transferred to the subject molecule. This configuration makes more efficient use of the input light and permits amplification of the emitted optical signal. Using such light sensitive input device the invention may be characterized as an optical to optical valve, which may be considered analogous to other types of mechanical and electrical valves, the latter for example including electron tubes, transistors, other semi-conductor devices, and the like.

Moreover, using such rhodopsin or other similar or dissimilar input and output devices may facilitate providing inputs to the subject molecules and obtaining useful outputs therefrom, for example without direct wire or fiber optics attachment, etc., thereto.

The invention may be characterized as a switch, an amplitude modulator, and/or an amplifier. As a switch the invention responds to an input to turn on or off a particular output, and this occurs at high speed, e.g. speeds on the order of $10^{-13}$ to $10^{-15}$ second. As an amplitude modulator the invention responds to an input to modulate the amplitude of an output, e.g. the intensity of light of a particular frequency, and this, too, can occur at the mentioned high speeds. As an amplifier the invention responds to an input, for example light, to produce an amplified output. The invention is described in detail with reference primarily to the producing of an optical output; however, the invention also may be used to produce electrical output.

In one embodiment of the invention the adsorbed molecules are on an electrode surface. The electrode and molecules are placed in an electrolyte, such as a liquid bath. Illumination is by a monochromatic optical source, preferably a laser. Potential from an electrical source is applied to the adsorbed molecules between the electrode and the electrolyte, which serves as the other electrode.

In another embodiment the molecules are of the macrocyclic type, for example, phthalocyanines, porphyrines, chlorophyls, hemes, or cytochromes, that have characteristics of doped semi-conductor materials; and such molecules may be used with other semi-conductor materials, such as conventional doped materials. Such semi-conductor materials provide the needed potential application to the adsorbed molecules to cause the overall structure to have operational characteristics of, for example, a transistor. Such macrocyclics exhibit p type semi-conductor properties and also are photoactive. Therefore, for such transistor to be complete, the other material used at the opposite sides of the p type material should be n type semi-conductor material. Another solid state semi-conductor type device in which the invention may be used is a diode and it is contemplated that other type semi-conductor devices also may employ the invention. The semi-conductor devices according to the invention may be used in conventional ways, e.g. relying on transistor action for an amplifier or switch, etc.

Exemplary uses of the invention include optical modulators in which optical output signals are modulated by an electrical input or by an optical input; optically responsive diode in which electrical signals are modulated in response to an optical input; optically responsive transistors; and amplifiers. The invention may be used as a memory type device, for example, for a computer or a computer type system, as a fast switch, or as a pulse shaper. The invention provides for fast optical readout of electrical signals and/or electrical readout of or response to optical signals.

The invention is described herein as responding to and outputting light. Such light preferably is in the visible spectrum; however, it is contemplated that electromagnetic radiation, e.g. light, outside the visible spectrum also may be employed depending, for example, on the materials used, the sensitivities thereof, etc. The words light, illumination, radiation and equivalents may be used equivalently herein.

Various objects and advantages of the present invention will become apparent from the description herein.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be employed.

In the annexed drawings:

FIG. 1 is a schematic illustration of an electro-optical switch system in accordance with the present invention utilizing a liquid electrolyte;

FIGS. 2 through 5 schematically illustrate several versions of electro-optical transistors in accordance with a modified embodiment of the invention;

FIG. 8 is a schematic illustration of a system for activating a silver electrode and for adsorbing molecules thereon;

FIG. 9 is a graphical representation of the Raman spectra measured at respective electric potentials across the macrocyclic monolayer, for example using the system illustrated in FIG. 1;

FIG. 10a is a volt-Raman graph for the 1346 cm$^{-1}$ Raman band, such graph having substantial bistable hysteresis; FIG. 10b is a graphical representation like that of FIG. 10a taken over a more limited voltage range to reduce bistable hysteresis; and FIG. 10c is a cyclic voltammogram obtained from the same material examined and producing the output illustrated in FIGS. 10a and 10b;

Figure 1:
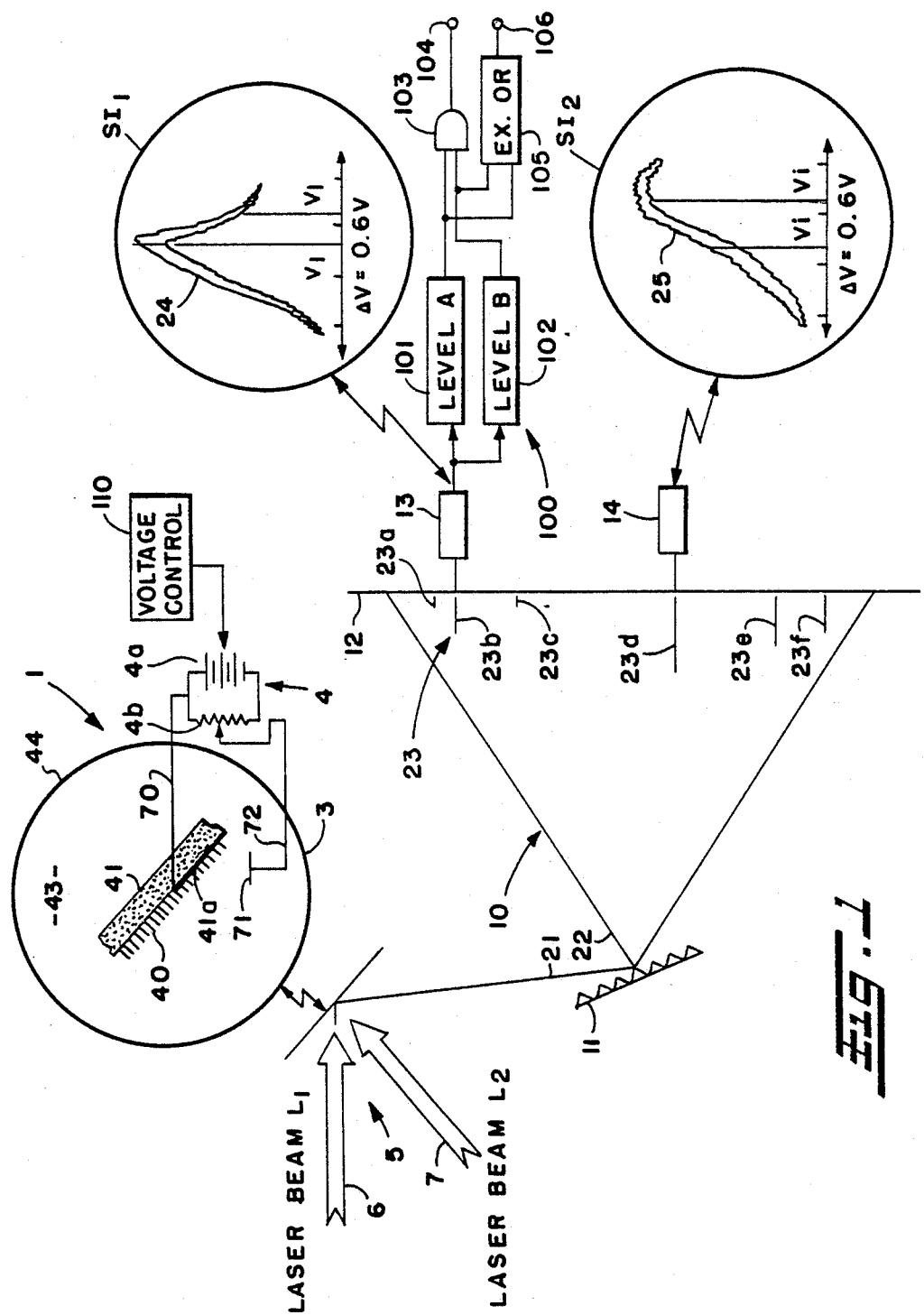
Figures 11A, 11B:
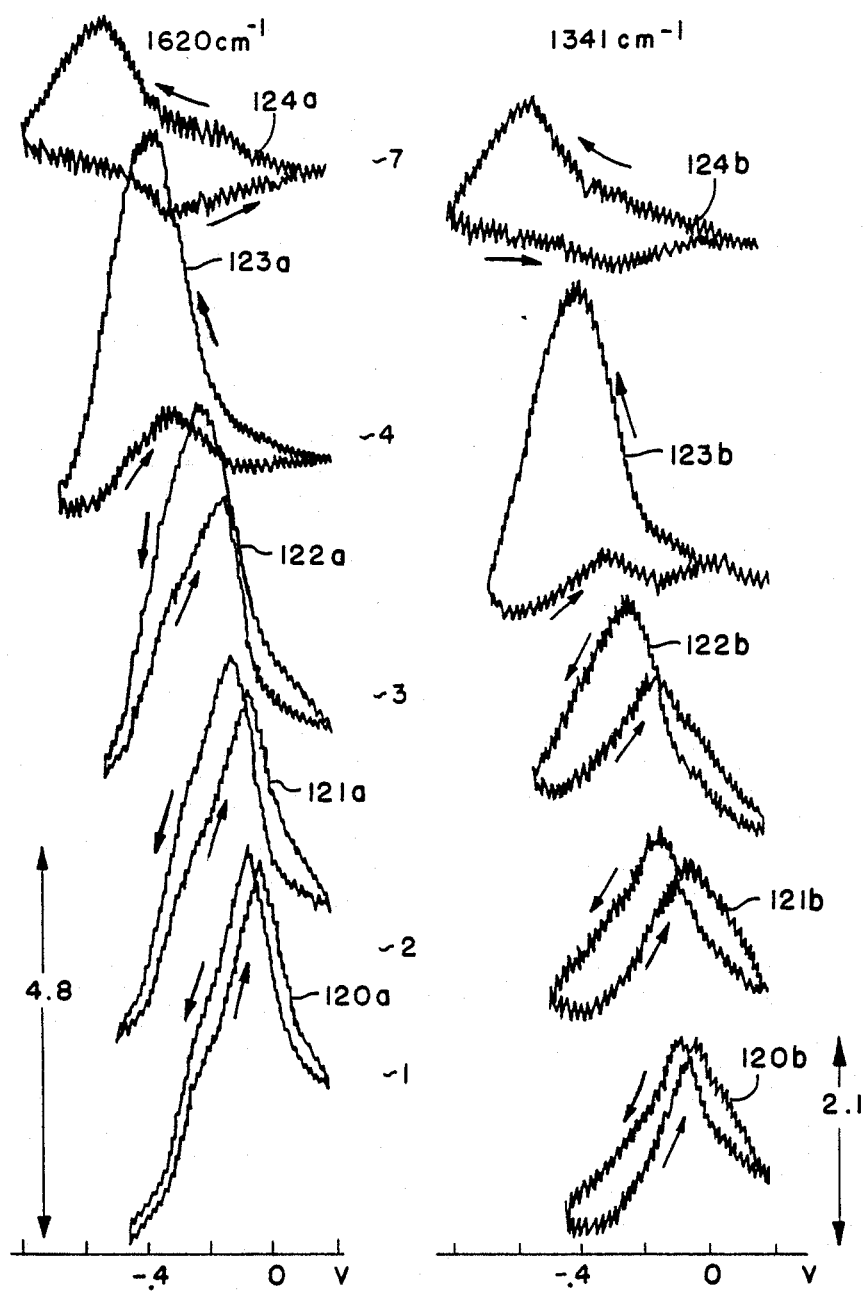
Figure 11C:
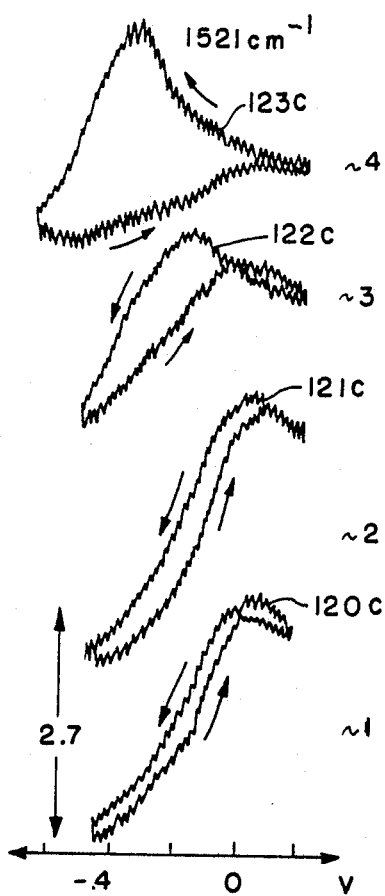
Figure 11D:
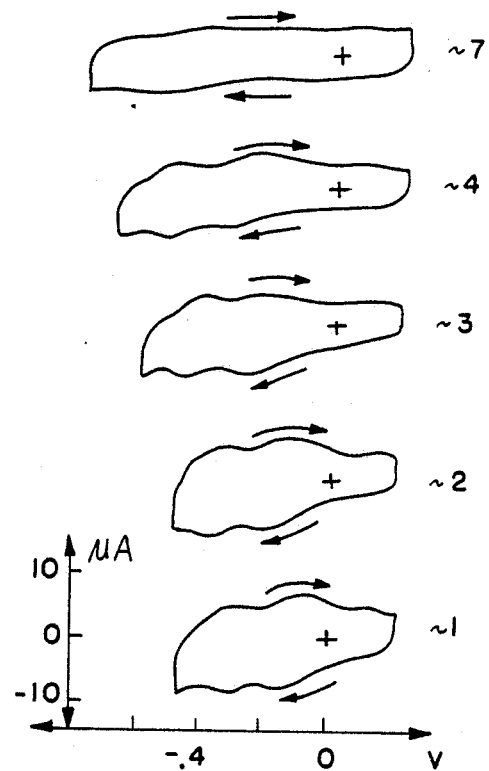

FIGS. 11a, 11b, and 11c are volt-Raman graphs for three Raman bands at different respective pH levels of the electrolyte, for example measured according to the system illustrated in FIG. 1; and FIG. 11d is an illustration of respective cyclic voltammograms corresponding to such pH levels;

FIG. 12 is a schematic illustration of an electro-optical memory and read-out system in accordance with the invention; and FIG. 13 is a schematic illustration of an electrical read-out arrangement for a molecular electro-optical device in accordance with the invention.

Referring now in detail to the drawings, wherein like references numerals designate like parts in the several figures, and initially to FIG. 1, an electro-optical system in accordance with the present invention generally is indicated at 1. In the system 1 there is illustrated a molecular electro-optical device schematically represented at 2. In FIG. 1 there is an enlarged illustration of one version of such device 2 in the form of a molecular electro-optical switch 3, which includes the subject molecules of the invention adsorbed on an electrode substrate. It will be appreciated, however, that the device 2 may be one of the molecular electro-optical solid state semi-conductor transistor type devices illustrated in FIGS. 2 through 5.

An electrical supply 4 is associated with the switch 3. In the preferred embodiments such electrical supply 4 may include a D.C. voltage source 4a and a variable resistor 4b type device, for example, to apply an electric potential across one or more layers of material employed in the switch 3. Automatic, electronic or other controls may be used to change such electric potential. An optical supply or input is represented schematically at 5 in FIG. 1. Such optical input 5 may include one of more sources of monochromatic optical radiation or light and most preferably is in the form of one or more laser beams 6, 7 from, for example, conventional laser devices. Although they are illustrated directed at different angles of incidence to the device 2, the laser beams 6, 7 are only schematically represented in FIG. 1.

A Raman spectrophotometer analyzer 10 is the remaining portion of the electro-optical system 1. The analyzer 10 includes a grating 11, which separates light received from the molecular electro-optical device 2 into its spatially distributed components, which are directed or projected, for example, onto a screen 12 or into a plane, for example, where they can be observed. Furthermore, the analyzer 10 includes one or more photosensitive detector devices, such as those shown at 13, 14, which may be, for example, photomultipliers, photosensitive diodes, or other device capable of producing a useful output, such as an electrical signal, representing intensity of light received thereby.

In operation of the electro-optical system 1, for example, incident illumination 20 is directed onto the molecular electro-optical device 2, such as the switch 3 described here or one of the transistors described below. Scattered or re-radiated light 21 from the device 2 is directed to the Raman spectrophotometer analyzer 10, which is used to analyze the intensity, wavelength, frequency, and/or spatial distribution of the components of such scattered or re-radiated light 21. The subject molecules of the invention are excitable in response to electrical and/or optical input thereto to change from a natural or unperturbed state to an excited one, and the level or extent of such excitation will depend, for example, on the electric potential (or other electric input) thereto or thereacross and/or the intensity and wavelength or frequency of light incident thereon. Such excitation causes ionization of the subject molecule(s) with the result that there appears to be an intramolecular charge transfer, trapping, or excitation to an excited state of an electron at a particular location in the molecule(s). The location of such trapping or excited electron, for example, may be a function of the input electric potential and/or light wavelength/frequency and/or intensity and may alter the natural vibrational characteristic of an intramolecular bond, which, accordingly, changes the optical characteristics of light emitted by the molecule(s). As used herein, then, reference to scattered, emitted, or re-emitted light from the subject molecules means that light emitted thereby in response to the electrical and/or optical exciting of the subject molecule(s). For a given wavelength, frequency, and intensity of incident illumination 20, the characteristics of the light analyzed by the analyzer 10 will be a function of the electric potential applied to the electro-optical switch 3 by the electrical supply 4. Moreover, for a constant electric potential applied to the switch 3 by the electrical supply 4, the characteristics of the light analyzed by the analyzer 10 also may be a function of the wavelength, frequency, and/or intensity of the incident illumination 20. Furthermore, an added dimension of the output, i.e. the information obtained by the analyzer 10, may be accomplished by varying both the incident illumination 20 and the electric potential provided by the electrical supply 4. Electric potential or other electrical characteristic of the device 2 also may be read out as a function of an optical and/or electrical input.

Preferably the analyzer 10 is a Raman spectrophotometer type to achieve a spatial distribution in the frequency domain of the scattered light as well as to measure the intensity thereof, particularly of the spectral components thereof. The operation of the Raman spectrophotometer, according to the invention, preferably is along the principles of surface enhanced Raman scattering. However, other optical analyzers could be used if capable of obtaining useful output from the re-radiated light 21, for example by analyzing the spatial distribution of the components thereof.

In the Raman spectrophotometer analyzer 10 the illustrated triangular envelope 22 represents the maximum extremities of the spatial distribution of the spectral components of the scattered or re-radiated light 21, for example. Within that envelope ordinarily would be a number of Raman spectrum lines, such as those depicted generally at 23 and particularly represented at 23a through 23f, for example, in FIG. 1. If the band pass on the monochromator of the spectrophotometer 10 for detector 13 is set to a relatively wide magnitude, such as 20 cm$^{-1}$ then the detector 13 can be used to produce an output curve in the form of a volt-Raman graph represented at 24 where the intensity of light monitored by the detector 13 is detected as a function of the electric potential applied by the electrical supply 4 to the molecular electro-optical switch 3. The graph 24 illustrates a certain bistable hysteresis characteristic, which will be discussed in greater detail below. A different volt-Raman graph 25 is shown for the detector 14 which is positioned with respect to the grating 11 and screen 12 to measure other Raman spectrum line area producing information representing intensity of light as a function of the electric potential applied by the electrical supply 4 to the molecular electro-optical switch 3.

The electro-optical system 1 is operative at typical room ambient temperatures of, for example, from about 60° Farenheit to about 80° Farenheit; there is no requirement for super cooling like that needed for Josephson junction technology.

Using the electro-optical system 1 as a high speed switch device, for example, for a given electric potential applied to the molecular electro-optical switch 3, the turning on and off of the incident illumination 20 will result in correspondingly turning on or off the scattered or re-radiated light. Switching times as short as from about $2 \times 10^{-13}$ second to about $5 \times 10^{-13}$ second have been achieved at room ambient temperature.

In accordance with an alternate embodiment of the invention, a molecular electro-optical transistor semiconductor device, such as those illustrated at 30, 31, 32 and 33 in FIGS. 2 through 5, may be substituted for the molecular electro-optical switch 3 in the electro-optical system 1 of FIG. 1. Such a modified system 1 would function optically generally quite similarly, if not identically, to the system described above employing the molecular electro-optical switch 3. Electrically, though, such a modified system 1 employing such a transistor or other solid state semi-conductor type device, could function somewhat differently than the switch 3. Briefly, such electrical operation would be of the conventional semi-conductor transistor type operation, for example, in which doped semi-conductor materials interact with respect to each other and, in particular, the electric potentials applied to such materials, most specifically to the junctions of such materials, enables a transistor type action. By appropriately biasing the respective junctions of differently doped materials, e.g. the respective pn junctions 34, 35, by the electrical supplies 36, 37 associated with the transistor 30 in FIG. 2, the ionization level of or the electric potential applied to the molecular electro-optical material 40, which is preferably a macrocyclic material, achieves appropriate changes in the intensity and/or spatial distribution of the Raman spectrum lines 23 (FIG. 1) analyzed from the scattered or re-radiated light 21.

Figure 7:
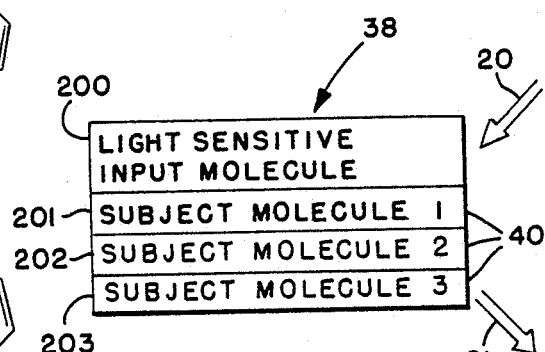
FIG. 7 is a schematic representation of an assemblage of a light sensitive input molecule and plural macrocyclic phthalocyanine molecules operatively interactive to function as a light amplifier.

In accordance with still another alternate embodiment of the invention, a molecular electro-optical amplifier type device or molecular structure may be substituted in either of the switch 3 or transistors 30-33. Such amplifier molecular structure 38 is shown in FIG. 7 including a phthalocyanine (or other macrocyclic) molecular portion and a light sensitive input molecule chemically bonded thereto. In response to the input of light to the input molecule, the same excites the macrocyclic portion, which effectively amplifies such excitation and, accordingly, produces an amplified light output.

Thus, the present invention encompasses the use of electro-optical responsive molecules in an electro-optical system as a switch and/or transistor or like devices to effect signal switching, signal modulation, and/or signal amplification. In the switch embodiment preferably electric potential is applied across the molecules via an electrode, preferably a metal electrode, such as a silver electrode, on which the molecules preferably are adsorbed, on the one hand, and a liquid electrolyte, on the other hand. If desired, a solid second electrode may be substituted for the electrolyte. In FIG. 1 such silver electrode is represented at 41; the molecules adsorbed on a surface of the electrode are represented at 40; and the electrolyte is represented at 43. The electrolyte 43 may be, for example, an acid, and, it as well as the electrode 41 with the molecules 40 adsorbed thereon, may be contained in an optically transparent container 44 such as a beaker or other preferably optically transparent container. Using the system of the invention as a transistor or other semi-conductor molecular electro-optical device 2, the molecules 40 (FIG. 2) preferably are of the macrocyclic type that have electro-optical characteristics, such as phthalocyanines, porphyrines, chlorophyls, hemes and cytochromes, and such material also should have doped semi-conductor properties. The just-mentioned materials naturally have p type doping characteristics. Therefore, referring to FIG. 2, for example, the other semi-conductor material, such as that depicted at 50, 51, preferably has n type doping characteristics. Such doped semi-conductor material 50, 51 together with the lead conection 52 provides for appropriate semi-conductor junction biasing and electric potential application/molecule ionization or excitation to effect the desired optical output response in the form of scattered or re-radiated light 21 by the molecules 40 in the transistor 30 in response to incident illumination 20.

It is noted here that the transistors 30-33 may be functional to respond to incident radiation thereby to change measurable output electrical characteristics of the transistor, as was mentioned above with respect to the molecular electro-optical switch 3. However, the detailed description of the invention will be directed primarily hereinafter to use of the electro-optical system 1 in accordance with the invention, either employing the switch 3 or one of the transistors 30–33, for example, to alter the optical output in response to the change in the input electric potential and/or incident illumination. The invention, nevertheless, is to be construed as encompassing the corollary of a change in measurable electrical characteristics in response, for example, to input electric potential and/or incident illumination or both.

In accordance with the preferred embodiment and best mode of the present invention, the molecules 40 are electro-optically active. Specifically, such molecules are active in a way that they re-emit light in response to incident radiation or illumination thereof. Moreover, preferably such re-emited light has an intensity and spatial distribution of the spectral components thereof that vary as a function of incident illumination and/or electric potential applied to the molecules. More preferably, and especially when the electro-optically responsive molecules are employed in a transistor device, the same preferably have doped semi-conductor properties, such as, for example, p type doped semi-conductor material, as is depicted in FIGS. 2–5 in the transistors 30–33. Such molecules also may be employed in the molecular electro-optical switch 3. Examples of the most preferred macrocyclic molecules are phthalocyanines, (sometimes abbreviated Pc), porphyrines, chlorophyls, hemes, and cytochromes, all of which have the desired electro-optical characteristics and p type semiconductor characteristics.

In one example water-soluble tetrasulfonated phthalocyanine was used as the electro-optical molecular material, and such material was adsorbed on a silver substrate, such as the electrode 41 illustrated in FIG. 1. Such a tetrasulfonated phthalocyanine (TSPc) molecule is represented at 60 in FIG. 6. The molecule 60 is composed of four pyrrole rings 61 and four benzene rings 62 which form greater inner and outer rings. The inner ring may contain two protons which form a metal-free phthalocyanine ($H_2$-Pc) or may have four coordinated central metal ions which creates a variety of metal-phthalocyanines (M-Pc). Such metal ions are represented by the letter "M" in FIG. 6. Such phthalocyanines are available commercially from Kodak Corporation, Rochester, N.Y.

Phthalocyanine molecules are insoluble in aqueous media unless polar groups are added to the molecule. The molecule 60 is tetrasulfonated, as can be seen by the four $SO_3$ polar groups illustrated in the FIG. 7. Sulfonation appears to have a minimal affect on the overall molecular characteristics. Sulfonation and solubility in aqueous media is advantageous to enable dissolving of the molecules in an aqueous medium and the use thereof in the adsorption process with respect to the electrode, preferably silver, or other substrate. If organic solvent or other solvent is used, then the molecules should be soluble in that solvent for the same reason.

Figure 6:
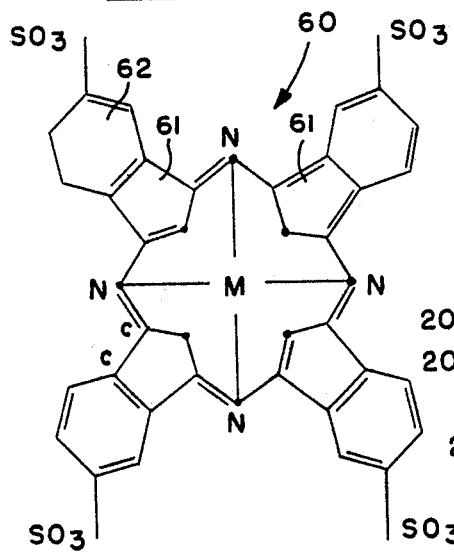
FIG. 6 is a schematic illustration of a macrocyclic molecule in the form of tetrasulfonated phthalocyanine, which may be employed in accordance with the present invention as an adsorbed monolayer on an electrode or semi-conductor substrate.

It is noted here that a porphyrine molecule appears somewhat similar to the phthalocyanine molecule 60 of FIG. 6; the difference is that porphyrine would not have the four benzene rings 62 and bridging nitrogen atoms are replaced by carbon atoms.

EXAMPLE 1

A macrocyclic material, specifically a tetrasulfonated phthalocyanine, was adsorbed on a silver electrode 41 (FIG. 1). Such molecules 40 were so adsorbed to form a monolayer film on the electrode. The silver electrode 41 was placed in a chemically clean aqueous bathing medium 65 (FIG. 8) of a pH 1 and 0.05 molar of sulfuric acid and $10^{-5}$ molar of macrocyclic (phthalocyanine) material and was subjected to annodization potential of 500 mv. versus a saturated calomel reference electrode 66 for 30 to 60 seconds; a potentiostat type device 67 was used to provide the electrical input for annodization in the usual potentiostat type of technique. This procedure was used to activate the silver interface and to form an adsorbed monolayer of macrocyclic molecules. The application of such potential to the silver is called activation of the silver.

EXAMPLE 2

Example 2 is the same as Example 1 except that the annodization potential was $-1.5$ volts and the annodization time during which such potential was applied was 1 minute. The results are substantially the same as in Example 1.

EXAMPLE 3

A silver electrode 41 was placed in a chemically clean aqueous bathing medium of 0.05 molar $H_2SO_4$. The electrode 41 was subjected to, e.g., 500 mv. versus the saturated calomel reference electrode for the times, as above described in Example 1 using the apparatus of FIG. 8; this activates the silver electrode. Then the silver electrode was removed from the bathing medium and was dipped into a solution of $10^{-5}$ molar tetrasulfonated phthalocyanine (TSPc) in water; thereafter the electrode was removed and the excess aqueous solution was allowed to evaporate to form a monolayer of adsorbed TSPc on the activated electrode.

EXAMPLE 4

Example 4 is the same as Example 3 except that the annodization potential to activate the silver electrode was $-1.5$ volts and the annodization time during which such potential was applied was 1 minute. The results are substantially the same as in Example 3.

In Examples 1–4 the molar concentration of subject molecules according to the invention, e.g. phthalocyanines, was selected to achieve adsorption of a monolayer film on the substrate. However, a greater molar concentration, say of $10^{-3}$, may be used if it were desired to adsorb a multilayer film. Moreover, other adsorption techniques may be used including, for example, vacuum deposition, vacuum film growth, epitaxial growth and sputtering. Moreover, adsorption of other subject molecules can be the same as in Examples 1–4 or other examples herein, but it may be necessary to adjust the molar concentrations of the subject molecules in order to accomodate the molecular size to achieve the desired monolayer or multilayer film.

The electro-optical system 1 was used to examine the adsorbed $H_2$-$TSP_c$ on the silver electrode. The electrode interface with adsorbed $H_2$-$TSP_c$ was illuminated with an argon ion laser line operating at 514.5 nm with output power of about 50 mW. The incident angle was 78° relative to the surface normal. Scattered light was observed at 90° relative to the incident light. The scattered light was analyzed by a Raman spectrophotometer 10 including, e.g. a double monochromator (Spex 1400). A photomultiplier, e.g. ITT FW130, and photon counting equipment were used as the detectors 13, 14. In FIG. 1 the monochromator is shown as grating 11 and screen 12 to illustrate spatial resolution of the light scattered by the molecules 40; however, the preferred Spex 1400 monochromator actually employs a scanning grating/fixed slit system, as is well known.

During such examination the electric potential applied to the molecules 40 was varied by the electrical supply 4. Such supply, for example, included a battery 4a or other voltage supply of D.C. potential and a variable resistor, potentiometer, rheostat 4b. Lead 70 connected one side of the battery to the silver electrode 41. An electrically conductive electrode 71 was connected via a lead 72 to the wiper arm of the variable resistor 4b to bring the potential of the electrolyte 43 to that of the wiper arm. Therefore, the electric potential across the molecules 40 was a function of the adjustment of the variable resistor 4b and the voltage level of the battery 4a.

The laser excited interface of silver and TSPc and electrolyte emitted scattered light in the form of surface enhanced Raman scattering. The activated silver electrode functioned as an amplifier with a typical gain factor of about $10^6$. The spectral components and intensity were a function of the intensity and frequency components of the input illumination and the electric potential across the molecules. The reason for high enhancement of the Raman signal by the activated silver electrode is not known at this time; but it is known that such enhancement does occur. The surface enhanced Raman scattering spectra which were obtained from the adsorbed TSPc in this example reliably reveals with reproducibility molecular vibrational properties of the macrocyclic species (TSPc in this case) in their solutions or solid phases, or adsorbed states. Reliable reproduction of molecular vibrational properties also was obtained in other examples by surface enhanced Raman scattering spectra for other adsorbed macrocyclic species.

In analyzing the scattered radiation 21 by the analyzer 10, one or more Raman spectrum lines will occur in response to certain changes of state of an electron within the molecule. Such state change of an electron may distort one of the bonds in the molecule, such as a carbon-carbon bond, a carbon-nitrogen bond, etc. Such state change and/or distortion will change the vibrational characteristics of that bond to cause a particular frequency or spatial distribution of frequencies of the scattered radiation 21.

The surface enhanced Raman scattering spectra obtained from the adsorbed TSPc on the silver electrode of the switch 3 shown in FIG. 1 are illustrated in FIG. 9 for four different electric potentials applied across the molecules 40. The intensities of the Raman lines show an appreciable change when the electrode potential is altered in discrete steps. The spectra in FIG. 9 were recorded with a relatively high resolution of the monochromator by using a 2.5 cm$^{-1}$ band pass. The spectra shown in FIG. 9 were obtained with a non-resonant laser excitation, although additional gain can be achieved by using resonant excitation, i.e. the laser being at a frequency equal to the resonant frequency of the molecule. For TSPc the resonant frequency is about 630 nm, 660 nm, or 340 nm. The peaks identified at 1341 cm$^{-1}$ in the graphs originates from a C-N bond in a pyrole ring, and this represents a spectral component due to the vibration of that specific bond in the molecule. Similarly, the 1521 cm$^{-1}$ peaks represent a spectral component due to vibration in a carbon-carbon bond also in the pyrole ring. The source of the 1620 cm$^{-1}$ spectral component is not known. The four spectra illustrated in FIG. 9 are measured, respectively, with $-0.4$ volt, $-0.2$ volt, 0 volt, and 0.2 volt electric potential across the molecules 40 (FIG. 1). The data illustrated in FIG. 9 represent intensity of light at respective frequencies. The intensity scale is in counts of photons per second by the optical detectors 13, 14, and the order of magnitude of the scale is $3 \times 10^4$ counts per second. The frequencies are from about 200 cm$^{-1}$ to about 1700 cm$^{-1}$.

The speed of switching, i.e. the time to respond to a particular input or change in a particular input, of the device 2 illustrated in FIG. 1 can be predicted or determined by inspection of the graph of FIG. 9 and relying on the Heisenberg uncertainty principle. For example, the rise time or fall time of the peak 75 for the carbon-carbon bond in a phthalocyanine molecule at a spectrum line 1521 in the overall Raman spectrum 76 taken at 0.2 volt electric potential applied to the phthalocyanine molecule can be resolved in a time domain. Such resolution indicates a response time on the order of $10^{-13}$ second. The response time was measured by measuring the half width at half height of the particular Raman band. Looking at FIG. 9 that width is measured in inverse centimeters. Such value in inverse centimeters, say 53 cm$^{-1}$, can be converted to frequency domain by multiplication by a factor $30(\text{pi}) \times 10^9$ Hz/cm$^{-1}$. The inverse of that result yields time; thus 53 cm$^{-1}$ can be converted to represent $2.0 \times 10^{-13}$ second. Similarly, response times can be obtained for other peaks in the other Raman bands.

From FIG. 9 it will be seen that the response of the phthalocyanine molecule or layer thereof at a given incident light frequency of input illumination and a constant pH will be a function of the electric potential applied across the molecule or layer thereof.

Each of the molecules 40 on use and analysis will yield 20 to 30 peaks in its particular Raman spectrum, such as one of the graphs of FIG. 9 having three of the peaks indicated at 1341, 1521 and 1620 cm$^{-1}$. Each of those peaks may be considered and used as a respective output of the molecule; therefore, each molecule is capable of multiple outputs. Furthermore, each of those multiple outputs usually is of different magnitude relative to the others; hence, such characteristic introduces in the invention a component of multilevel operation.

The speed of such switching or change in an output characteristic of a given macrocyclic molecule or layer thereof in response to a given input or change in input is exceedingly fast, e.g. on the order of $10^{-13}$ second. This fast response time can be used in a variety of ways. One example is to speed the response of information read-out by existing detector apparatus, such as a Raman spectrophotometer. Another example is to link optically and/or electrically two or more devices 2 in accordance with the invention, whereby the output from one directly or indirectly provides an input to the other. In the latter case logic gates and systems having extremely fast operation can be created.

In FIG. 10a is illustrated a graph 90 of the intensity of light re-emitted or scattered by iron-phthalocyanine molecules at the 1346 cm$^{-1}$ frequency, such intensity being graphed with respect to electric potential applied across the molecules or layer 40 (FIG. 1) thereof. As the voltage is increased from about $-0.4$ volt to about plus 0.2 volt the curve line 91 represents the functional interrelationship between scattered light intensity with respect to applied electric potential. A maximum 92 is reached during the course of that function and variation of potential. When the potential is reduced the graph line 93 is followed, and a peak 94 is achieved. The peak 94 exceeds the magnitude of the peak 92, as can be seen relative to the count per second on the intensity scale. Thus, graph 90 exhibits bistable hysteresis. The graph or curve of FIG. 10a was made using a relatively low resolution or wide band pass of 20 cm$^{-1}$ in the monochromator of the analyzer 10 to accomodate frequency shifts that occur with changes of input potential.

The bistable hysteresis characteristics of the graph or curve 90 can be exploited to provide, for example, a logic function. For example, a measurement of a peak at 92 may be used to represent a digital logic 0 level, whereas a peak 94 may be used to represent a digital logic 1 level. Therefore, the transition of the electric potential from the maximum negative or some point negative before the peak 92 is reached to a more positive level beyond where the maximum 92 is reached can be relied on to identify a logic 0 level; specifically, a signal transition in the input potential from −0.4 volt to +0.2 volt will result in the peak 92 being reached and, thus, the signal transition from negative to positive effectively represents a logic 0. In like manner the positive to negative transition resulting in production of the peak 94 can be used to identify a logic 1 signal. Shown in FIG. 1 is decoding circuitry 100 that may be used to detect such logic signal transitions. Such decoding circuitry 100 may include a pair of level detectors 101, 102, which respectively produce logic 1 output signals when a respective maximum or peak 92, 94 is reached during a particular signal transition. If both of the peaks are produced, then an AND gate 103 will produce a signal at output terminal 104 representing such occurrence, and thus, the excursion from the positive to the negative electric potential. On the other hand, if only the exclusive OR gate 105 produces a signal at its output 106, the same will indicate that only one of such peaks has occurred, i.e. the lower peak 92, and this will indicate and excursion of the electric potential in a positive direction.

Also shown in FIG. 1 is a voltage control 110. The voltage control 110 may be mechanically or electrically connected to the electrical supply 4 in order to adjust the electric potential applied to the molecules 42 in the molecular electro-optical switch 3 (or any of the other molecular electro-optical devices 2 used in accordance with the present invention). Such voltage control 110 may be an amplifier circuit, an electro-mechanical device that controls the variable resistor 4b, a solid state circuit, a computer type circuit, etc. One purpose of the voltage control 110 is to achieve a desired electric potential applied to the molecules 40; another purpose may be to limit potential; and so on.

Turning to FIG. 10b, the portion 93 of the graph 90 between the peak 94 and the minimum, which occurs at +0.2 volt, is represented at 93'. By using the voltage control 110 (FIG. 1) to limit the electric potential applied to the molecules 40 to that potential shown between about −0.2 volt and +0.2 volt, the bistable hysteresis function of the graph 90 can effectively be eliminated. Moreover, if the voltage control 110 further were operative to limit the electric potential applied to the molecules 40 to that between voltages $V_1$ and $V_2$ shown in FIG. 10b, a near linear relation between electric potential and intensity of light emitted by the molecules 40 at the 1346 Raman spectrum line can be achieved, as is represented at the curved portion 93" in FIG. 10b.

Referring now to FIG. 10c there is shown a cyclic voltammogram corresponding to the adsorbed iron-phthalocyanine on a silver electrode in aqueous solution of 0.05 molar $H_2SO_4$ and illustrates the relationship between voltage and current for this particular adsorbed molecule. In addition, humps or peaks in the cyclic voltammogram indicate oxidation and reduction states of the adsorbed molecules. Cyclic voltammetry can be used to help explain electro-chemical states of the adsorbed molecules and interrelate optical changes of the Raman scattered light to the electro-chemical state of the adsorbed molecules.

FIGS. 11a, 11b and 11c show graphs or curves of the relationship of intensity of light emitted at certain Raman spectrum lines as a function of the electric potential across the molecules, particularly the phthalocyanine molecules 42 of FIG. 1, at different respective pH levels of the electrolyte 43. For example, in FIGS. 11a and 11b the five pairs of graphs 120a-124a and 120b-124b respectively show the functional relationship of intensity versus electric potential applied to the layer of molecules 42 (FIG. 1) for light emitted at the 1620 cm$^{-1}$ Raman spectrum line and 1341 cm$^{-1}$ Raman spectrum line for different respective pH of the electrolyte 43. Such pH levels, respectively, are represented by the illustrated digits 1, 2, 3, 4, and 7 adjacent the respective curves. The intensities illustrated in FIGS. 11a and 11b are relative intensities and are not intended to represent absolute intensities. However, for frame of reference, the distance indicated 4.8 in FIG. 11a represents a scale of $4.8 \times 10^4$ counts per second, and the distance 2.1 in FIG. 11b represents a scale of $2.1 \times 10^4$ counts per second, as measured by the above mentioned photo detector equipment.

In FIG. 11c are four respective graphs 120c-123c similar to those described above but measured with a monochromater setting 1521 cm$^{-1}$ in the system FIG. 1 at the four different indicated pH concentration levels 1, 2, 3, and 4 shown in FIG. 11c.

In FIG. 11d are illustrated 5 respective cyclic voltammograms for the respective pH concentrations 1, 2, 3, 4, and 7 corresponding, for example, to the graphs illustrated in FIGS. 11a, 11b and 11c.

From the graphs illustrated in FIGS. 11a-11d, it will be seen that pH concentration of the electrolyte 43 may have a significant affect on the functional relationship between intensity of emitted light of the molecules 40 and the electric potential applied to the molecules. A more linear relationship appears to occur at the lower pH levels. Various portions of the curves or functional interrelationships of intensity and electric potential can be used to achieve certain desired outputs with respect to linearization or measurements over particular ranges, etc. Likewise, parameters can be selected to accomplish the above-mentioned decoding of electric potential change direction and maxima to optimize desired optical/electric outputs for particular uses and equipment.

EXAMPLES 5A AND 5B

Examples 5A and 5B are the same as Examples 1 and 2 except that porphyrine is substituted for the phthalocyanine. The results of operation are substantially the same as those described above.

EXAMPLES 6A AND 6B

Examples 6A and 6B are the same as Examples 1 and 2 except that chlorophyl is substituted for the phthalocyanine. The results of operation are substantially the same as those described above.

EXAMPLES 7A AND 7B

Examples 7A and 7B are the same as Examples 1 and 2 except that heme is substituted for the phthalocyanine. The results of operation are substantially the same as those described above.

EXAMPLES 8A AND 8B

Examples 8A and 8B are the same as Examples 1 and 2 except that cytochrome was substituted for the phthalocyanine. The results of operation are substantially the same as those described above.

In Examples 5–8 changes in the molar concentration of the molecules in the solvent or bathing solution may have to be made to obtain the desired monolayer or mutilayer film. Also, in all the above examples, although the solvent may be water for water soluble molecules, the solvent used in the annodizing bath or dipping bath may be another, such as an organic solvent, in which the molecules will dissolve.

In each of the examples described above the substrate 41 is a silver electrode, which exhibits enhancement of the Raman scattered light due to the activation of the silver electrode in the electrolyte described above. However, other substrates or electrodes may be used. The inventor believes that such activation of silver electrodes is due to the formation of a semi-conductor layer, which is represented at 41a at part of the electrode 41 in the drawing of FIG. 1, during the adsorption process. Such activation of the substrate or electrode 41 appears to enhance significantly the output of the molecular electro-optical device 2, particularly the switch 3. The actual reason for such enhancement or increase in the intensity of the output, i.e. the intensity of light emitted or scattered by the molecules 40 is not known.

Figure 2:
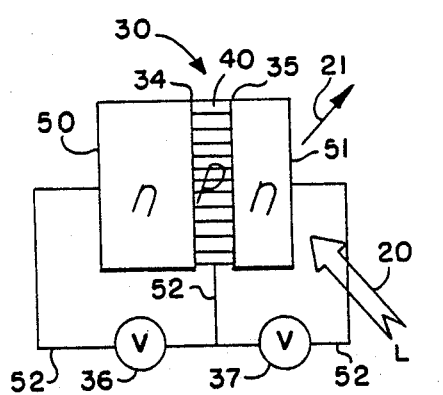

In the preferred embodiment and best mode of the present invention a semi-conductor material is substituted for the electrolyte bath 43 of the switch 3 shown in FIG. 2. The molecules of the type described above, accordingly, are used in a semi-conductor type device that does not require an electrolytic bath. For such semi-conductor devices the molecules preferably are of a type that have or are capable of having doped semiconductor characteristics, and examples of such semiconductor type devices are the transistors 30, 31, 32, or 33 illustrated in FIGS. 2–5, respectively. The invention also may be employed in semi-conductor devices other than transistors.

Referring to the transistor 30 (FIG. 2) as exemplary, the molecules 40 are adsorbed onto the substrate 50 or are otherwise deposited thereon to form the p-n junction 34. A further p-n junction 35 is formed by applying another layer 51 of semi-conductor material over the molecules 40. The layer 51 preferably is rather thin so that it is optically transmissive to the incident light 20, allowing the same to impinge on the molecules 40, and to the light scattered or emitted by the molecules 40, which is represented at 21. In the preferred embodiment and best mode of the invention, the molecules 40 are macrocyclic which naturally have p type doped semiconductor characteristics. Accordingly, the semi-conductor layers 50, 51 preferably are n type doped semiconductor material. The preferred macrocyclic molecules and the preferred semi-conductor type materials for the layers 50, 51 are listed above. Other materials also may be used as long as they have similar characteristics of operating in the manner of a semi-conductor or doped semi-conductor material. The semi-conductor devices also may be other than transistor devices, for example diodes.

Operation of the molecular electro-optical transistor 30 is similar to operation of the molecular electro-optical switch 3 described above with reference to FIG. 1, and as was mentioned above the transistor 30 may be substituted for the switch 3 in the system 1. More particularly, electric potential or other electric input can be applied to the molecules 40 via the leads 52a, 52b, 52c and the semi-conductor layers 50, 51. The electric supplies 36, 37, which preferably are DC voltage sources, provide the needed power. Incident light 20 is directed through the layer 51 onto the molecules 40. In response to that incident light and the electric potential, the molecules will scatter or re-emit light 21 in the same way that the molecules 40 respond, as is described above with reference to FIG. 1. A unique advantage of the molecular electro-optical transistor 30 is that such device operates not only as a device capable of providing an optical output, but also such device functions in the same way as a conventional transistor device. Thus, for example, the transistor 30 may be used in an emitter follower configuration, as an amplifier for electrical signals, etc. Therefore, the transistor 30 has a plurality of capabilities both in the electronic usage thereof, in the optic usage thereof, and in the combined electro-optical useage thereof. Also, electrical read-out of optical signals can be achieved because the electrical characteristics of the device 30 will vary as a function of incident light 20. A particular advantage of the transistor 30 over the switch 3 is the portability of the transistor. Specifically, a relatively non-portable electrolyte is not required for the transistor 30; rather, the electrical input required for operation to affect the optical output in the transistor 30 is achieved by the material forming the semi-conductor layers 50, 51.

Figure 3:
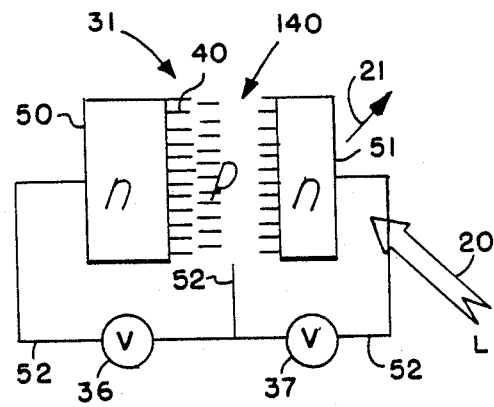
Figure 4:
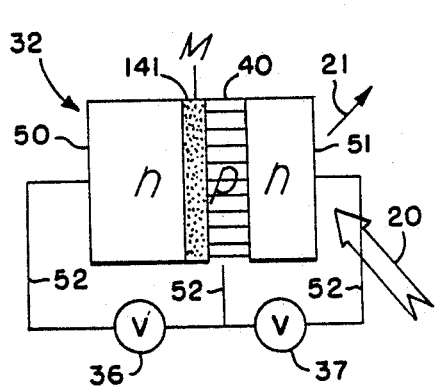
Figure 5:
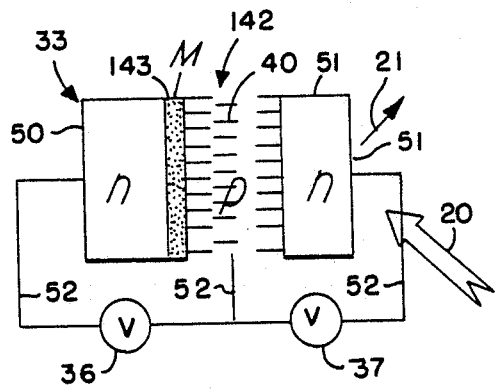

FIGS. 2, 3, 4 and 5 can be distinguished, as follows. In FIG. 2 the molecules 40 in accordance with the invention make up a monolayer, i.e. about one molecule thick, between the semi-conductor layers 50, 51. In FIG. 3, the molecules 40 form a multi-layer 140 thereof between the semi-conductor layers 50, 51. In FIG. 4 the molecules 40 form a monolayer and are actually adsorbed onto an electrically conductive substrate 141, such as silver or silver oxide which is located between the semi-conductor layer 50 and the molecules. Such conductor 141 may be employed to achieve the desired electric potential application to molecules 40 but could be eliminated, as in the transistor 30, if adequate electric potential can be applied to the molecules 40 in the monolayer using only the semi-conductor materials 50, 51. Another advantage to using the layer 141, especially if it is silver, is the possibility of activating the same to achieve gain effect mentioned above. In FIG. 5 the transistor 33 has a multi-layer 142 of molecules 40, and those molecules are adsorbed onto the metal conductor substrate 143 as in the case of the conductor 141 described with reference to the transistor 32 in FIG. 4. Operation of the several transistors 31, 32, and 33 would be the same as operation described above for the transistor 30.

EXAMPLE 9

Processes similar to those described above may be used to deposit/adsorb subject molecules onto semiconductor material, especially using dipping, sputtering, vacuum deposition and epitaxial growth. The bathing medium may have to be altered to avoid corrosivity with respect to the semi-conductor substrate material. Formation of macrocyclic films on semi-conductor substrates can be achieved by conventional techniques, and the same is true with respect to formation of semi-conductor film in the macrocyclic material. Thus, for example, using available semi-conductor techniques and the preferred macrocyclic molecules a device can be made having the macrocyclic molecules sandwiched between the semi-conductor layers.

Both the switch 2 and transistors 30–33 may be used in accordance with the invention to provide a switching function. Specifically, in response to the input light and a particular electric potential, the output light or a particular spectral component thereof may be switched on or off. The speed of response of such switch is on the order of $10^{-13}$ second and may be as fast as the order of $10^{-15}$ second, especially if the molecule exhibits tunnelling. The invention also may be used to modulate the intensity of an output signal as a function of incident illumination on the molecules 40 and/or electric potential applied thereto. Response to such modulation likewise is extremely fast. Such switching and modulating operations can be employed in a way that a single input, either optical or electrical, can affect multiple outputs, e.g. in the form of the individual spectrum components of the scattered or re-emitted light from the molecules.

In FIG. 12 is illustrated an embodiment of the invention used as an electro-optical memory or read-out type of device. Such memory is depicted at 150, and it includes an array of a plurality of cells, such as those identified 151, 152. Each cell may be in the form of a molecular electro-optical transistor 30 including discrete doped semi-conductor layers 50, 51, etc. with a monolayer or multiple layers of molecules 40 therebetween. Thus, it will be appreciated that the solid state or semi-conductor embodiments of the invention have an important advantage of conveniently lending to inclusion in a relatively large scale (in terms of actual cells) but small size memory or read-out type device. As an example, using presently available technology each cell can be on the order of 2 microns by 2 microns; therefore, a density of $0.25 \times 10^8$ of unit cells or elements per square centimeter can be achieved. Upon application of appropriate electric potential to the molecules in a given cell such as cell 151, the same operates substantially identically to molecular electro-optical transistor 30 of FIG. 2. Such cell may be optically scanned by a conventional laser scanner 153, and in response to such scanning and the potential across the molecules 40 of the individual cell, such cell will emit light 21 which can be detected and analyzed by the optical detector/analyzer 154, which may be analagous to the Raman spectrophotometer 10 described above in detail with reference to FIG. 1.

The laser 153 may illuminate the entire array of cells. Leads schematically shown at 155 may be used to alter the potential of respective cells. The detector/analyzer 154 may include a focusing lens 157 and a focal plane lens 158 which cooperate to collect light scattered by respective cells producing beyond the lens 158 an image that can be analyzed by the Raman spectrophotometer 10 or by other optical detector means. In the case that laser simultaneously illuminates all or, in any event, more than one cell in the device 150, the detector 10 will have to scan the cells. Alternatively, as was mentioned above, respective cells may be coupled directly to other cells in another device 150 which responds to the outputs and/or excitation of the former. As a further alternative, a non-scanning detector 10 may be used if the laser 153 scans discrete cells of the array device 150.

The memory/read-out device 150, scanner 153 and detector/analyzer 154 form an electro-optical read-out system 160. The system 160 can be used to detect electric potential of a given cell and to convert that information to optical information for subsequent detection in the detector/analyzer 154. Minimum current flow and, therefore, minimum power is required by the memory device 150 to maintain the electric potential across the respective molecules 40 in the individual cells. Such electric potential can be discretely controlled for individual cells by computer or other means connected by the illustrated leads to the respective semi-conductor layers. Since there is minimum electric power required for the device 150, the amount of heat emitted thereby will be minimized. Since the operation of the molecules 40 is extremely fast, scanning in the system 160 also can be extremely fast, thus potentially increasing the speed of operation capability of the computer or other apparatus in which the system 160 is included. Another important advantage of the system 160 is the ability to rely on multiple outputs from each cell so that each cell has the capability of actually storing multiple information, given electric potential condition thereof, for example.

Thus, it will be appreciated that the invention may be used to effect prompt conversion of electrical signals and/or information to optical signals and/or information. Moreover, the invention may be used to facilitate fast optical read-out of an electrical memory device.

The optical amplifier illustrated in FIG. 7 may be substituted in the switch 2 or one of the molecular electro-optical transistors 30–33 for the layer or layers of molecules 40 therein. In the light amplifier molecular structure 38 there are a plurality of molecules 40 in accordance with the present invention, preferably macrocyclics, and most preferably phthalocyanine, which are placed in close proximity to each other and may be chemically bonded to each other. Preferably such molecules 40 are such that they are stacked or otherwise relatively adjacent to each other generally in the manner illustrated in FIG. 7. The amplifier 38 also includes a light sensitive input molecule 200, in the preferred embodiment and best mode of the invention rhodopsin, (another example would be maleic-fumuric complexes) chemically bonded to the molecules 40 in the outer layer. The light sensitive input molecule 200 responds to light input generally or to a particular frequency/-wavelength characteristic by going into an excited state. In such excited state, an electron is freed or becomes more excited than in its unperturbed state. Such excitation is readily transferred directly to a molecule 40 to which the light input molecule 200 is chemically bonded. Such bonding may occur in a way similar to the way in which one of the $SO_3$ polar groups is attached to the phthalocyanine molecule in FIG. 6. Thus, as is illustrated in FIG. 7 there are 3 phthalocyanine molecules 201, 202, 203, and the light sensitive input molecule 200 is chemically bonded to the first phthalocyanine molecule 201 using available organic synthesis techniques. The excitation of the light sensitive input molecule 200 is transferred to the electro-optical molecule 201 causing the latter to become excited and to emit light of a particular spectral characteristic. That light and such excitation are transferred to the next adjacent electro-optical molecule 202, e.g. another phthalocyanine, further exciting the same and causing the same to emit light of the same spectral components; but in this case the preferred spectral components will be of greater intensity than those of the light emitted by the molecule 201 because of the dual excitation of the molecule 202, both in terms of the transfered electrical excitation and the optical input thereto. The same type of amplification occurs with respect to the molecule 203 in response to inputs from molecules 202. A light output 21, then, is produced at the last molecule 203 in response to the light input 20 to the input molecule 200. The light input 20 may have a spectral component identical to one of the amplified spectral components included in the light output 21. However, due to the above described amplification effect, the intensity of the noted spectral component in the light output 21 may exceed the intensity of the same spectral component included in the light input 20.

Accordingly, the light sensitive input molecules 200 may be used to couple light inputs to respective molecules 40 in accordance with the present invention to enhance the intensity of preferred spectral components in the light output produced thereby. The invention has application in optical communication transmission devices, e.g. by selectively amplifying light of a particular frequency, such as that to which the input molecule is especially sensitive.

Another technique for enhancing or increasing the intensity of the light output, and particularly the intensity of a specific spectral component from the molecules 40 is to provide thereto optical input at a frequency that is substantially identical to the frequency of the natural vibration of the molecular bond thereof. For example, the Raman spectrum line at 1341 cm$^{-1}$ shown in FIG. 9 is due to the natural vibrational frequency of a carbon-nitrogen bond. The desired frequency of the incident light to the molecules 40 at the frequency which corresponds to such 1341 cm$^{-1}$ spectral line can be achieved by using two coherent monochromatic light sources, such as lasers 6, 7 which interfere with each other so as to produce incident illumination that is at a frequency corresponding to such 1341 cm$^{-1}$ Raman spectrum line. Such illumination is in accordance with the coherent anti-Raman Stokes principle. Operation using such principle results in a much higher intensity output from the molecules 40. However, such operation according to such principle will result in only a single output being produced by the molecules 40 rather than the multiple outputs described above. By scanning one of the laser frequencies an enhancement of the Raman signal at other frequencies can be achieved.

Briefly referring to FIG. 13, there is shown schematically a circuit for reading electrically the response of a device 2 according to the invention to an optical input and a particular potential input. A voltage input control 110 controls the magnitude of electric potential applied by the source 4 to the device 2. A meter 220 reads current, for example, to detect the response of the device 2 to the input potential and input light. This exemplary read-out or other ones may be used with the several embodiments of the invention described herein to obtain an electrical read-out of optical or even of electrical input to the device 2.

In view of the foregoing, it will be appreciated that the invention may be used as an electro-optical switch or as an electro-optical semie conductor device. In the latter case, the semi-conductor device most preferably is an electro-optical transistor. However, the invention may be employed with other types of semi-conductor systems, such as four or more semi-conductor layer systems, etc. Inputs may be provided by conventional lasers, semi-conductor laser devices, and other sources of optical illumination, preferably of the monochromatic type and most preferably of the coherent type. The materials of which the invention may be employed are described above. Other materials that would function equivalently also may be employed. The invention also embodies methods of switching, modulating and amplifying consistent with the above description.

I claim:

1. A high speed electro-optic device, comprising a substrate including electrical conductor or semi-conductor material, and electro-optic responsive macrocyclic molecules adsorbed on said substrate, said molecules being responsive to at least one of an electrical input or an optical input to effect a high speed output function; said molecules being operative to produce an optical output as a carrier of information, said optical output being resolvable spatially in the frequency domain to read out generated or stored information; and further comprising Raman spectrometer means for spatially resolving such optical output in the frequency domain; and wherein said molecules are responsive to at least one of an electrical input or an optical input to undergo a detectable intra-molecular electron transfer or intra-molecular electron energy change to effect an output function.

2. The device of claim 1, said optical input means comprising a monochromatic light source.

3. The device of claim 2, said light source comprising at least one laser.

4. The device of claim 1, wherein said molecules comprise molecules from the group comprising phthalocyanines, porphyrines, chlorophyls, hemes and cytochromes.

5. The device of claim 1, said substrate comprising a conductor from the group comprising silver, gold, copper, and aluminum, and halides thereof.

6. The device of claim 5, further comprising a semiconductor material interface between said molecules and substrate.

7. The device of claim 1, said substrate comprising a semi-conductor from the group comprising doped or non-doped galium arsenide, tin oxide, zinc oxide, silver oxide, cadmium sulfate and germanium.

8. The device of claim 7, further comprising a conductor interface between said molecules and substrate.

9. The device of claim 1, said substrate comprising an organic material.

10. The device of claim 1, further comprising an electrolyte, said substrate and said electrolyte being positioned with respect to said molecules to apply an electric input thereto.

11. The device of claim 10, said electric input comprising an electric potential.

12. The device of claim 1, further comprising an optically responsive input molecule means chemically bonded to at least one of said molecules for responding to an optical input to excite said at least one of said molecules.

13. The device of claim 12, wherein said molecules comprise molecules from the group comprising phthalocyanines, porphyrines, chlorophyls, hemes and cytochromes, and said input molecule means comprises rhodopsin or maleic-fumuric complexes.

14. The device of claim 12, said molecules comprising a plurality of same, said input molecule means being chemically bonded to fewer than all of said molecules, and said molecules being positioned with respect to each other to respond to excitation of at least one respective adjacent said molecule to amplify the output therefrom.

15. The device of claim 1, further comprising electrical input means for applying an electrical input to said molecules, said electrical input means including said substrate, and optical input means for applying an optical input to said molecules.

16. The device of claim 15, said molecules being responsive to switching of such optical input to effect a switching function as such output function.

17. The device of claim 16, each of said molecules including a molecular bond, the effecting of such switching function being due to the change in vibration of such bond in response to an intra-molecular charge transfer effected by such optical input.

18. The device of claim 15, wherein said molecules produce an optical output that can be spatially resolved in the frequency domain to plural signal outputs, at least two of such signal outputs being different respective functions of at least one of such electrical input and such optical input.

19. The device of claim 18, wherein said molecules are responsive to at least one of such electrical input and such optical input to switch on and off respective signal outputs.

20. The device of claim 18, wherein said molecules are responsive to at least one of such electrical input and such optical input to modulate respective signal outputs.

21. The device of claim 18, further comprising an optically responsive input molecule means chemically bonded to at least one of said molecules for responding to an optical input to excite said at least one of said molecules, and wherein said molecules are responsive to excitation by said input molecule means and such electrical input to produce an amplified signal output in the form of an output light intensity of a particular spectral component that is capable of exceeding input light intensity of such particular spectral component received by said input molecule means.

22. The device of claim 18, said Raman spectrometer means comprising detector means for detecting respective signal outputs.

23. The device of claim 22, further comprising measuring means for measuring the magnitudes of such detected signal outputs.

24. The device of claim 1, said device comprising a semi-conductor device, and said substrate comprising respective layers of semi-conductor material positioned with respect to said molecules to form said semi-conductor device.

25. The device of claim 24, said molecules comprising a monolayer thereof.

26. The device of claim 25, further comprising a conductor positioned between and in electrical engagement with said molecules and one of said substrate layers.

27. The device of claim 24, said molecules comprising multiple layers thereof.

28. The device of claim 27, further comprising a conductor positioned between and in electrical engagement with at least one layer of said molecules and one of said substrate layers.

29. The device of claim 24, wherein the thickness of at least one of said substrate layers is sufficiently small to be effectively optically transparent to enable input light to be transmitted through to said molecules and light emitted by said molecules to be transmitted out from said device.

30. The device of claim 1, wherein in response to a given optical input said molecules emit light having a spectral component that varies in intensity as a function of electric potential applied to said molecules, said function having a bistable hysteresis curve characteristic.

31. The device of claim 36, further comprising input means for applying an electric potential input and an optical input to said molecules, and control means for limiting the potential variation of such electric potential input to restrict such intensity variation of such spectral component to avoid bistable hysteresis of such function.

32. The device of claim 36, further comprising input means for applying an electric potiential input and an optical input to said molecules, and detector means for detecting the maximum of such intensity for a given direction of change of such electric potential and decoder means for decoding such maximum as a representation of such direction of change past a bistable hysteresis curve maximum.

33. The device of claim 36, said substrate comprising a solid, and further comprising an electrolyte cooperative with said solid to apply an electric potential to said molecules, said electrolyte having a pH, and such function and such bistable hysteresis curve characteristic varying in response to such pH.

34. The device of claim 1, at least some of such molecules having a molecular bond which exhibits a particular vibrational characteristic frequency, and further comprising optical input means for illuminating said molecules with light having an effective frequency at least substantially the same as such particular vibrational characteristic to cause such intra-molecular electron transfer or intra-molecular electron energy change.

35. The device 34, said optical input means comprising at least two light sources, each providing a coherent monochromatic light at a respective frequency, said coherent monochromatic lights being directed onto said molecules for subtractive interference whereby the difference between the frequencies of such lights at least substantially equals the vibrational characteristic frequency of such molecular bond.

36. The device of claim 35, said light sources comprising respective lasers, and said lasers interacting according to the coherent anti-Raman Stokes principle.

37. The device of claim 35, further comprising detector means for detecting light emitted by said molecules at such particular vibrational characteristic frequency.

38. The device of claim 1, said molecules having a molecular bond, said bond having a vibrational characteristic, said molecules having a detectable output characteristic responsive to the vibrational characteristic of such bond, and said vibrational characteristic being alterable in response to an electrical or optical input to change such output characteristic.

39. The device of claim 38, said change being either in intensity or frequency of light emitted by said molecules.

40. The device of claim 1, said device comprising a plurality thereof on a single support, optical and electrical input means to apply respective inputs to said devices, and read-out means for reading out information from respective devices.

41. The device of claim 40, said devices being responsive to inputs or changes of inputs in fast time on the order of $10^{-13}$ to $10^{-15}$ second.

42. The device of claim 41, said devices being so responsive at room ambient temperatures.

43. The device of claim 41, said devices being positioned on such support with a density on the order of $0.25 \times 10^8$ per square centimeter.

44. The device of claim 1, wherein said substrate and molecules are cooperatively related to be read out using surface enhanced Raman spectrometry.

45. A high speed electro-optic switch system, comprising a substrate comprised of at least one of an electrical conductor or semi-conductor material; electro-optic responsive macrocyclic molecules comprising at least one of phthalocyanine molecules, porphyrine molecules, chlorophyl molecules, heme molecules and cytochrome molecules, said molecules being adsorbed on said substrate and responsive to at least one of an electrical input or an optical input to undergo an intra-molecular electron transfer or intra-molecular electron energy change as a carrier of information; input means for supplying to said molecules at least one of an electrical input or an optical input; and a Raman spectrometer output means for reading out such information.

46. The system of claim 45, said input means comprising a monochromatic light source.

47. The system of claim 46, said input means comprising at least one laser.

48. The system of claim 45, said substrate comprising a conductor from the group comprising silver, gold, copper, and aluminum, and halides thereof.

49. The system of claim 48, further comprising a semi-conductor material interface between said molecules and substrate.

50. The system of claim 45, said substrate comprising a semi-conductor from the group comprising doped or non-doped galium arsenide, tin oxide, zinc oxide, silver oxide, cadmium sulfate and germanium.

51. The system of claim 50, further comprising a conductor interface between said molecules and substrate.

52. The system of claim 45, said substrate comprising an organic material.

53. The system of claim 45, said input means comprising an electrolyte, said substrate and said electrolyte being positioned with respect to said molecules to apply an electric input thereto.

54. The system of claim 53, said electric input comprising an electric potential.

55. The system of claim 45, further comprising an optically responsive input molecule means chemically bonded to at least one of said molecules for responding to an optical input to excite said at least one of said molecules.

56. The system of claim 55, wherein said input molecule means comprises rhodopsin or maleic-fumuric complexes.

57. The system of claim 55, said molecules comprising a plurality of same, said input molecule means being chemically bonded to fewer than all of said molecules, and said molecules being positioned with respect to each other to respond to excitation of at least one respective adjacent said molecule to amplify the output therefrom.

58. The system of claim 45, said input means comprising electrical input means for applying an electrical input to said molecules, said electrical input means including said substrate, and optical input means for applying an optical input to said molecules.

59. The system of claim 58, said molecules being responsive to switching of such optical input to effect a switching function as such output function.

60. The system of claim 59, each of said molecules including a molecular bond, the effecting of such switching function being due to the change in vibration of such bond in response to an intra-molecular charge transfer effected by such optical input.

61. The system of claim 58, wherein said molecules produce an optical output that can be spatially resolved in the frequency domain to plural signal outputs, at least two of such signal outputs being different respective functions of at least one of such electrical input and such optical input.

62. The system of claim 61, wherein said molecules are responsive to at least one of such electrical input and such optical input to switch on and off respective signal outputs.

63. The system of claim 61, wherein said molecules are responsive to at least one of such electrical input and such optical input to modulate respective signal outputs.

64. The system of claim 61, further comprising an optically responsive input molecule means chemically bonded to at least one of said molecules for responding to an optical input to excite said at least one of said molecules, and wherein said molecules are responsive to excitation by said input molecule means and such electrical input to produce an amplified signal output in the form of an output light intensity of a particular spectral component that is capable of exceeding input light intensity of such particular spectral component received by said input molecule means.

65. The system of claim 61, comprising detector means for detecting respective signal outputs.

66. The system of claim 65, further comprising measuring means for measuring the magnitudes of such detected signal outputs.

67. The system of claim 45, said substrate comprising respective layers of semi-conductor material positioned with respect to said molecules to form said semi-conductor device.

68. The system of claim 67, said molecules comprising a monolayer thereof.

69. The system of claim 68, further comprising a conductor positioned between and in electrical engagement with said molecules and one of said substrate layers.

70. The system of claim 67, said molecules comprising multiple layers thereof.

71. The system of claim 70, further comprising a conductor positioned between and in electrical engagement with at least one layer of said molecules and one of said substrate layers.

72. The system of claim 67, wherein the thickness of at least one of said substrate layers is sufficiently small to be effectively optically transparent to enable input light to be transmitted through to said molecules and light emitted by said molecules to be transmitted out from said device.

73. The system of claim 45, wherein in response to a given optical input said molecules emit light having a spectral component that varies in intensity as a function of electric potential applied to said molecules, said function having a bistable hysteresis curve characteristic.

74. The system of claim 73, said input means comprising means for applying an electric potential input and an optical input to said molecules, and control means for limiting the potential variation of such electric potential input to restrict such intensity variation of such spectral component to avoid bistable hysteresis of such function.

75. The system of claim 73, said input means comprising means for applying an electric potential input and an optical input to said molecules, and said output means comprising detector means for detecting the maximum of such intensity for a given direction of change of such electric potential and decoder means for decoding such maximum as a representation of such direction of change past a bistable hysteresis curve maximum.

76. The system of claim 73, said substrate comprising a solid, and said input means comprising an electrolyte cooperative with said solid to apply an electric potential to said molecules, said electrolyte having a pH, and such function and such bistable hysteresis curve characteristic varying in response to such pH.

77. The system of claim 45, at least some of such molecules having a molecular bond which exhibits a particular vibrational characteristic frequency, and said input means comprising optical input means for illuminating said molecules with light having an effective frequency at least substantially the same as such particular vibrational characteristic to cause such intra-molecular electron transfer or intra-molecular electron energy change.

78. The system 77, said optical input means comprising at least two light sources, each producing a coherent monochromatic light at a respective frequency, said coherent monochromatic lights being directed onto said molecules for subtractive interference whereby the difference between the frequencies of such lights at least substantially equals the vibrational characteristic frequency of such molecular bond.

79. The system of claim 78, said light sources comprising respective lasers, and said lasers interacting according to the coherent anti-Raman Stokes principle.

80. The system of claim 78, said output means comprising detector means for detecting light emitted by said molecules at such particular vibrational characteristic frequency.

81. The system of claim 45, said molecules having a molecular bond, said bond having a vibrational characteristic, said molecules having a detectable output characteristic responsive to the vibrational characteristic of such bond, and said vibrational characteristic being alterable in response to an electrical or optical input to change such output characteristic.

82. The system of claim 81, said change being either in intensity or frequency of light emitted by said molecules.

83. A multiple switch system comprising a plurality of high speed electro-optic switch systems of claim 45 on a single support, said input means comprising both optical and electrical input means to apply respective inputs to said switch systems, and read-out means for reading out information from respective switch systems.

84. The system of claim 83, said switch systems being responsive to inputs or changes of inputs in fast time on the order of $10^{-13}$ to $10^{-15}$ second.

85. The system of claim 84, said switch systems being so responsive at room ambient temperatures.

86. The system of claim 84, said switch systems being positioned on such support with a density on the order of $0.25 \times 10^8$ per square centimeter.

87. The system of claim 45, wherein said substrate and molecules are cooperatively related to be read out using surface enhanced Raman spectrometry.

* * * * *